United States Patent [19]

Kurosawa et al.

[11] Patent Number: 5,175,693
[45] Date of Patent: Dec. 29, 1992

[54] METHOD OF DESIGNING SEMICONDUCTOR INTEGRATED CIRCUIT DEVICE

[75] Inventors: Sachiko Kurosawa; Tamotsu Hiwatashi, both of Yokohama, Japan

[73] Assignee: Kabushiki Kaisha Toshiba, Kawasaki, Japan

[21] Appl. No.: 486,544

[22] Filed: Feb. 28, 1990

[30] Foreign Application Priority Data

Jun. 1, 1989 [JP] Japan ................................. 1-137464

[51] Int. Cl.⁵ ............................................. G06F 15/20
[52] U.S. Cl. .................................... 364/491; 364/488
[58] Field of Search ................ 364/488, 489, 490, 491

[56] References Cited

U.S. PATENT DOCUMENTS

| 4,612,618 | 9/1986 | Pryor et al. ..................... 364/488 X |
| 4,688,072 | 8/1987 | Heath et al. .................... 364/491 X |
| 4,815,003 | 3/1989 | Putatunda et al. ............. 364/489 X |
| 4,831,543 | 5/1989 | Mastellone ..................... 364/490 X |
| 4,918,614 | 4/1990 | Modarres et al. .................... 364/490 |
| 4,978,633 | 12/1990 | Seefeldt et al. ................ 364/491 X |
| 5,050,091 | 9/1991 | Rubin ............................. 364/490 X |
| 5,062,054 | 10/1991 | Kawakami et al. ............ 364/490 X |
| 5,067,091 | 11/1991 | Nakazawa ..................... 371/22.3 X |

FOREIGN PATENT DOCUMENTS 63-25778 2/1988 Japan .

OTHER PUBLICATIONS

"Data Structures and Network Algorithms", authored by Robert E. Tarjan of Bell Laboratories, Murray Hill, N.J. (No date).
"An Interactive/Automatic Floor Planner for Hierarchically Designed Cell Based VLSIs", authorized by Tamotau Hiwatashi et al of Toshiba Corporation, Kawasaki, Japan. (No date).
"A Min-Cut Placement Algorithm for General Cell Assemblies Based on a Graph Representation", 16th Dac; Ulrich Lauther Siemens AG; 1979.

Primary Examiner—Parshotam S. Lall
Assistant Examiner—Edward R. Cosimano
Attorney, Agent, or Firm—Oblon, Spivak, McClelland, Maier & Neustadt

[57] ABSTRACT

A method for designing a semiconductor integrated circuit device using a standard cell or gate array method. A chip is divided into a plurality of blocks to realize a hierarchical layout design in units of blocks. A first scheme is preferentially dividing a first module constituting a logical connection description and having a large height and an occupation area smaller than standard value. A second embodiment is preferentially dividing a second module having a small height and an occupation area larger than a standard value. The first and second embodiments are selected in accordance with a hierarchical structure of the modules in a logical connection description. Thereafter, processing for dividing the first or second module in correspondence with areas of the plurality of blocks is executed using a computer on the basis of the selected one of the first and second embodiments.

7 Claims, 7 Drawing Sheets

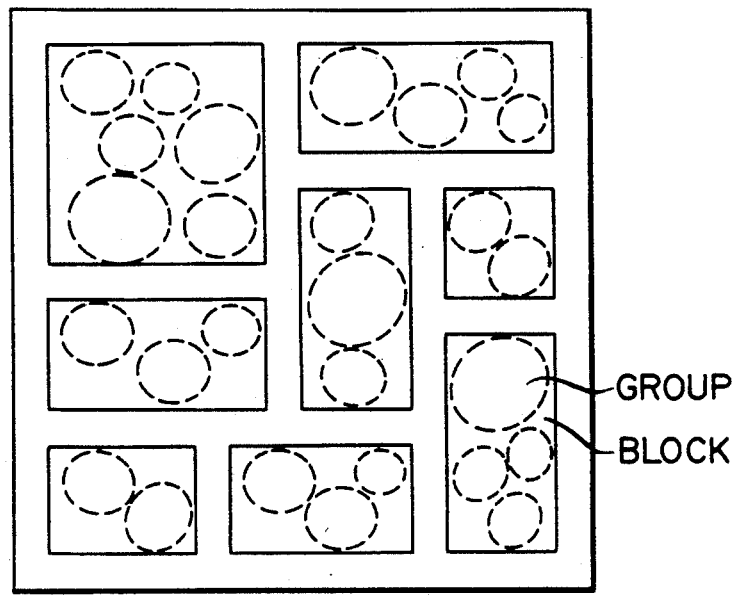
F I G. 5A
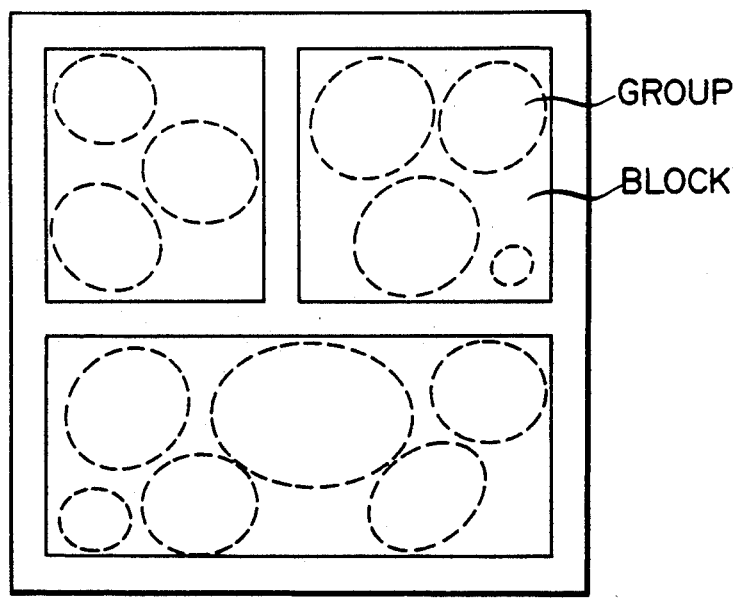
F I G. 5B

METHOD OF DESIGNING SEMICONDUCTOR INTEGRATED CIRCUIT DEVICE

BACKGROUND OF THE INVENTION

1. Field of the Invention

The present invention relates to a method of designing a semiconductor integrated circuit device of a hierarchical placement and hierarchical routing, and a hierarchical placement and global routing system, in a standard cell or gate array method.

2. Description of the Related Art

In a method of designing a semiconductor integrated circuit device of a hierarchical placement and global routing system and a hierarchical placement and global routing system in a conventional standard cell or gate array method, a logical connection description having a hierarchical structure is expanded in advance into a flat level. Thereafter, the hierarchy structure is divided into areas corresponding to sizes of blocks defined on a chip. The other method is that a module having hierarchy of height is artificially created and arranged as a block to separate from other blocks.

However, when a logical connection description is made, a designer is skilled in contents of logical connections. As a result, the designer often makes a logical connection description in a bottom-up manner based on the content of a logical connection. Alternatively he often takes a connection previously used into a part of the logical connection description. In a conventional automatic dividing method, originally meaningful hierarchies must be destroyed into the flat level, and the module having the hierarchy must be divided again to rebuild hierarchical structure of higher level regardless of the original meanings.

Once a layout is completed, a logical connection must often be partially corrected due to a logical connection description error or timings. In this case, an initial description does not correspond to blocks on the layout and is inconsistent. Therefore, although the designer is skilled in the contents of logical connections, he cannot correct only one block and must lay out the entire chip again.

SUMMARY OF THE INVENTION

It is an object of the present invention to provide a method of designing a semiconductor integrated circuit device, with which a logical connection description having a hierarchical structure can be appropriately and easily realized on blocks on a layout.

In order to achieve the above object, according to a method of designing a semiconductor integrated circuit device of the present invention, upon application of a hierarchical layout designing method of dividing a chip into a plurality of blocks and realizing a layout design in units of blocks when a semiconductor integrated circuit device is designed using a standard cell or gate array method, processing for dividing a logical connection description as a layout object while maintaining its hierarchical structure is executed by using a computer. A first scheme of preferentially dividing a first module constituting the logical connection description and having a relatively high hierarchy and a smaller occupation area than a standard value, as a unit of a layout design, or a second scheme of preferentially dividing a second module having a low hierarchy and a larger occupation area than the standard value, as a unit of a layout design, is selected in accordance with the hierarchical structure of modules in the logical connection description.

Furthermore, in order to achieve the object of the present invention, according to the method of designing the semiconductor integrated circuit device, an upper limit of an occupation area when a layout is realized by divided modules can be selected in accordance with one of a first condition constituted by the size, number, arrangement, and the like of a plurality of blocks, a second condition constituted by the number, presumed area, and the like of modules having predetermined height in a hierarchical structure, and a third condition which includes both the first and second conditions. The logical connection description can be divided on the basis of the selected condition as a standard upper limit of a predetermined module.

With the above steps, the present invention can reduce the number of processes of a conventional method, i.e., expansion and rebuilding, and can avoid the entire circuit redesign upon correction since blocks on the layout correspond to a hierarchical structure in a logical connection description. For this reason, a logical connection description is automatically divided while leaving originally meaningful hierarchical structure, such as a hierarchical structure which is described in a bottom-up manner based on the content of a logical connection description by a designer who is skilled in it, a logical connection description which is previously used by the designer and is taken into a part of a logical connection description, and the like.

In general, areas of modules in a logical connection description are not constant, and depths thereof also vary. It is very difficult for a third party to optimally divide a module having different sizes and depths in every units of objective motifs, and, hence, it is difficult to achieve such a dividing operation by automatic processing. Whether a low hierarchy module having a large area is to be divided or is left as one module can be determined by on'y a designer depending on cases. According to the present invention, in a module having different sizes and depths in units of motifs, whether a low hierarchy module having a larger area is to be divided or is left as one module can be externally selected. In addition, the magnitude of division can be externally adjusted.

The "depth" and "height" of a module in a hierarchical structure will be defined below.

A target module including a large number of another modules up to an uppermost module when the target module in a logical connection description is followed from it toward the uppermost module (in a direction from a cell toward a chip) will be referred to as being a "deep" hierarchy module. The depth of a module is expressed by the number of another modules. If a target module is present immediately below a chip, this module is assumed to have a "depth 1". If another module is present below a module having a depth 1, this module has a "depth 2". In FIG. 1, a module 1 has a depth 0, modules 2 and 3 have a depth 1 each, a module 4 has a depth 2, a module 5 has a depth 3, and modules 6 and 7 have a depth 4 each. Reference numerals 21-27, 61, 62, 71, 72, 81, 82, 91, 92, 101, 102 and 111-114 denotes cells.

A target module including a large number of another modules to a lowermost module when the target module in a logical connection description is followed from it toward the lowermost module in a direction (from a chip toward a cell) will be referred to as being a "high" hierarchy module. If only a cell is present below a certain module and does not include an intermediate module having a cell or another module, this module is assumed to have a "height 1". If a module having a height 1 is present below the target module, this module has a "height 2". In FIG. 1, modules 2, 6, 7 have a height 1 each, a module 1 has a height 5, a module 3 has a height 4, a module 4 has a height 3, and a module 5 has a height 2.

According to the present invention, a logical connection description having a hierarchical structure is divided into sizes while leaving the hierarchical structure so that a plurality of divided modules are mapped to each divided block. In general, areas of modules in a logical connection description are not constant, and depths thereof also vary. It is very difficult for a third party, i.e., automatic processing to optimally divide a logical connection description having different sizes and depths in units of objective motifs. Whether a module having a height 1 and a large area is to be divided or is left as one module can be determined by only a designer depending on cases.

According to the present invention, in order to solve this problem, whether a module having a height 1 and a larger area is to be divided or is left as one module can be externally selected. In addition, according to the present invention, a standard value having a magnitude of division based on a given block, or a logical connection description having a hierarchical structure to be divided, or based on both is automatically prepared. The magnitude of division of the standard value can also be externally adjusted.

According to the present invention, when a hierarchical layout design is to be realized, in a hierarchical structure, logical connection descriptions are grouped, and a group of logical connection descriptions are arranged in the same block. Therefore, logical connection descriptions can be appropriately arranged without destroying the hierarchical structure.

According to the present invention, when hierarchical layout design is to be realized, two schemes, i.e., a scheme of preferentially dividing a module of a high hierarchy and a scheme of preferentially dividing a module having a lower height than a second standard value and a large area can be selected as a first means in consideration of the hierarchical structure of a logical connection description. In addition, there can be executed module division control in consideration of a structure of a divided block in a chip as a second means, module division control in consideration of a hierarchical structure of a logical connection description as a third means, and module division control simultaneously taking both the structure of the divided block in a chip and the hierarchical structure of the logical connection description into consideration as a fourth means. Therefore, hierarchical design suitable for both the hierarchical structure of the logical connection description, and the hierarchical structure upon layout of a chip can be attained. The first standard value of hierarchy height may be identical with the second standard value. The first or second standard value of hierarchy height, for example, is 2.

The operations of the four different means as the characteristic features of the present invention will be described in detail below. Assume that a variable for determining whether a module having a height 1 and a large area is to be divided or left is represented by P, a variable indicating the magnitude of division is represented by A, a standard value of a magnitude of division (block area) is represented by M, and an upper limit value of the magnitude of division (maximum block area) is represented by U.

When $P=0$, the module having a height 1 and a large area is left.

When $P+1$, a module having a great height and medium-size is left.

A is the positive number, and a module is divided to have a size 1/A of the standard value in accordance with the value A.

That is, when $0<A<1$, a module is divided to have a size larger than the standard value M.

When $A=1$, a module is divided to have a size equal to the standard value M.

When $A>1$, assume that a module is divided to have a size smaller than the standard value M.

(a) When $P=0$ and $0<A<1$ (1) A module having a height 1 and a large area is divided into areas set between the maximum value U and the minimum value M/A, and the divided modules are grouped.

(2) The remaining module is divided to have a size M/A, and the divided modules are grouped.

When $M/A>U$, the module is divided to have a size less than U, and the divided module are grouped.

(b) When $P=1$ and $0<A<1$ (1) A module having a great height and medium-size is divided into areas set between the maximum value U and the minimum value M/A, and the divided modules are grouped.

(2) The remaining module is divided to have a size M/A without destroying its hierarchical structure, and the divided modules are grouped.

When $M/A>U$, the module is divided to have a size less than U, and the divided module are grouped.

(c) When $P=0$ and $A\geq 1$ (1) A module having a height 1 and a large area is divided into areas set between the maximum value M and the minimum value M/A, and the divided modules are grouped.

In this case, since the size defined by M/A is smaller than that in (a), if a large value A is set, a difference of division is increased.

(2) The remaining module is divided in the size M/A, and the divided modules are grouped.

(d) When $P=1$ and $A\geq 1$ (1) A module having a great height and medium-size is divided into areas set between the maximum value M and the minimum value M/A, and the divided modules are grouped.

Since the size defined by M/A is smaller than that in (b) as in (c), if a large value A is set, a difference of division is enhanced.

(2) The remaining module is divided in the size M/A while leaving its hierarchical structure, and the divided modules are grouped.

Each group is mapped to a block in units of the above-mentioned groups, so that a layout of divided blocks is attained while leaving a desired hierarchical structure. In this case, the standard value M and the upper limit U of the magnitude of division are determined by one of the third and fourth means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrates presently preferred embodiments of the invention and, together with the general description given above and the detailed description of the preferred embodiments given below, serve to explain the principles of the invention.

FIG. 5A shows a state wherein groups are mapped in a small block;

FIG. 5B shows a state wherein groups are mapped in a large block;

DETAILED DESCRIPTION OF THE PREFERRED EMBODIMENTS

Figure 1:
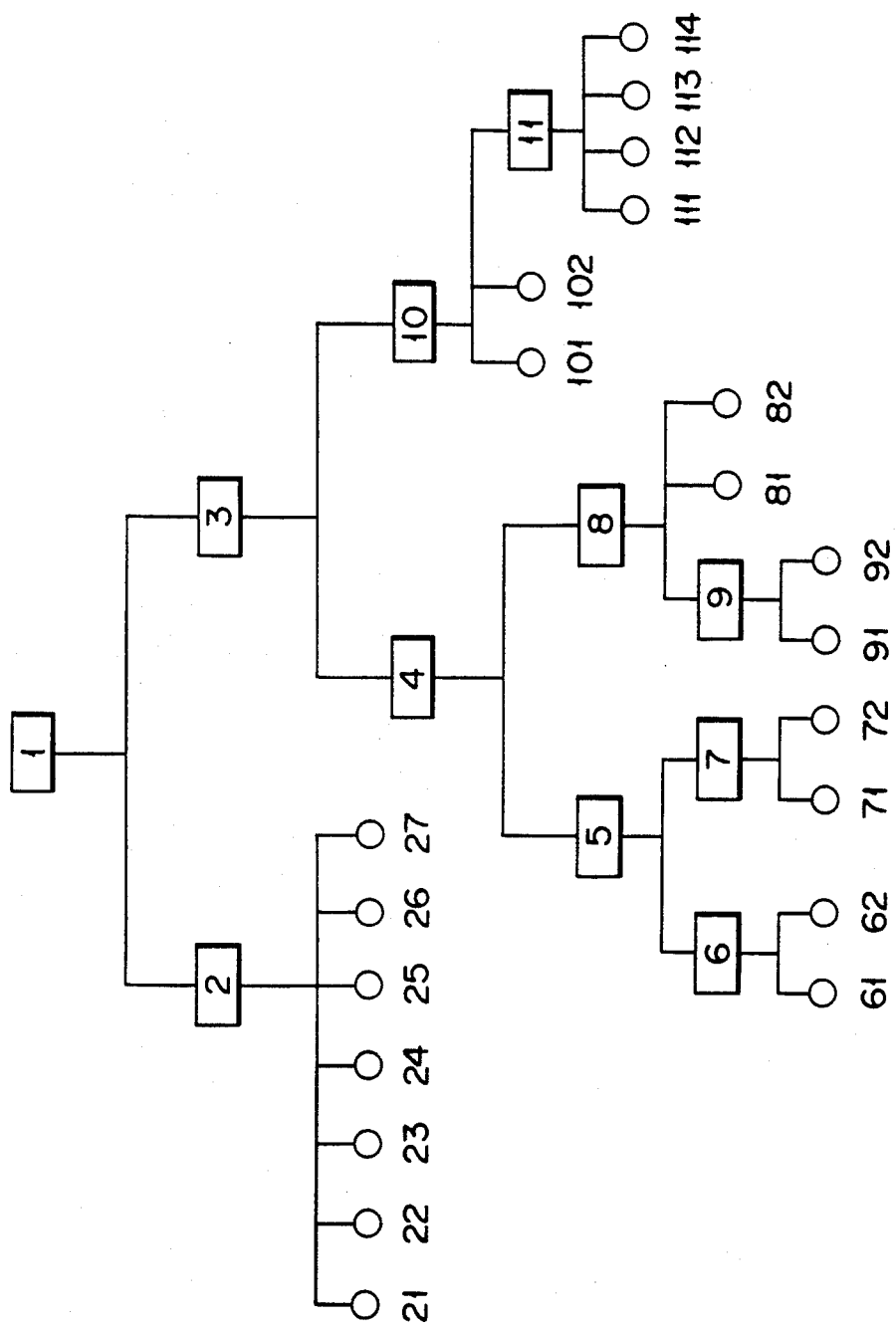
FIG. 1 is a view for explaining the depth and height of a module having a hierarchical structure.
Figure 2:
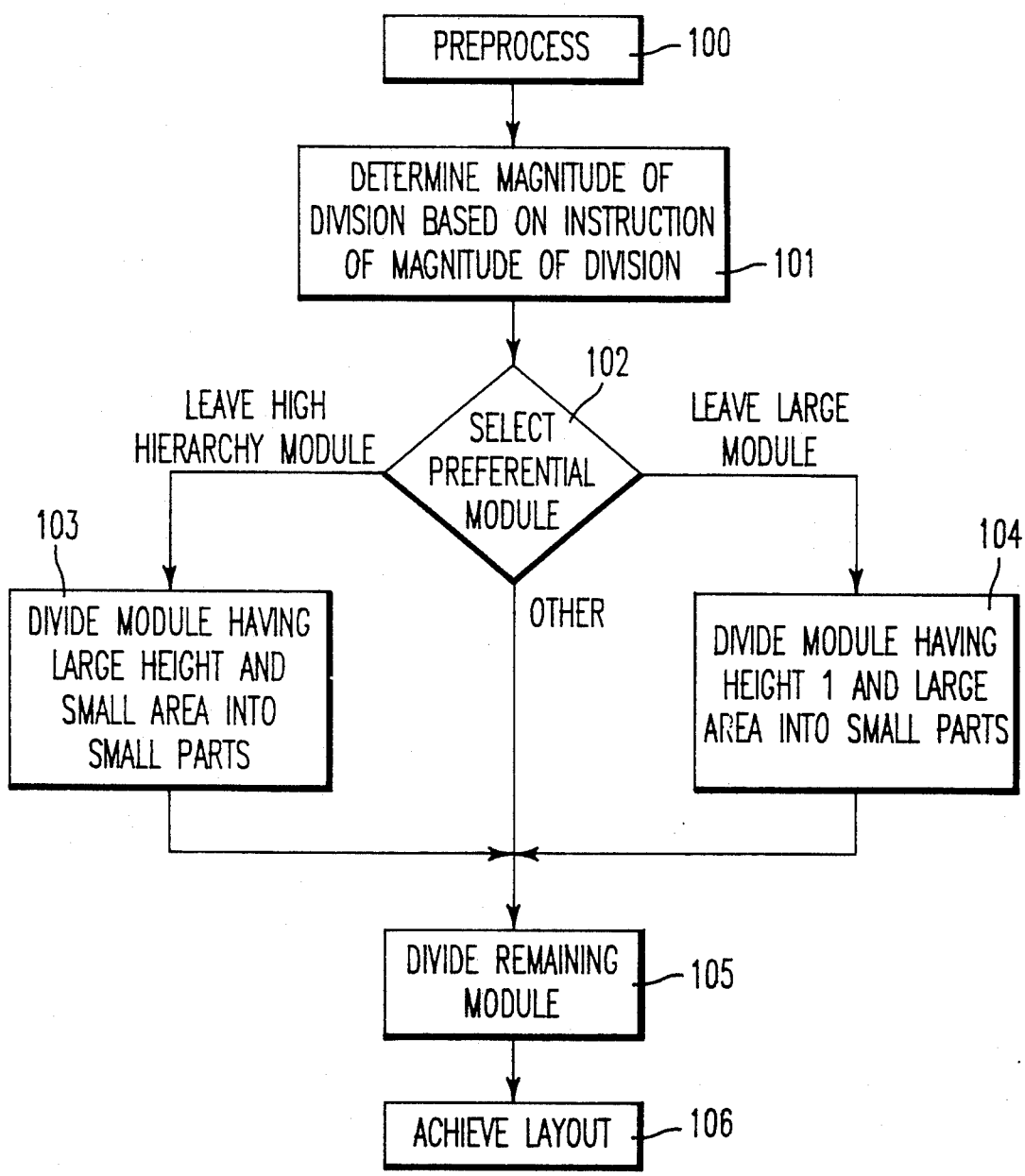
FIG. 2 is a flow chart of processing according to the first embodiment of the present invention.
Figure 3A:
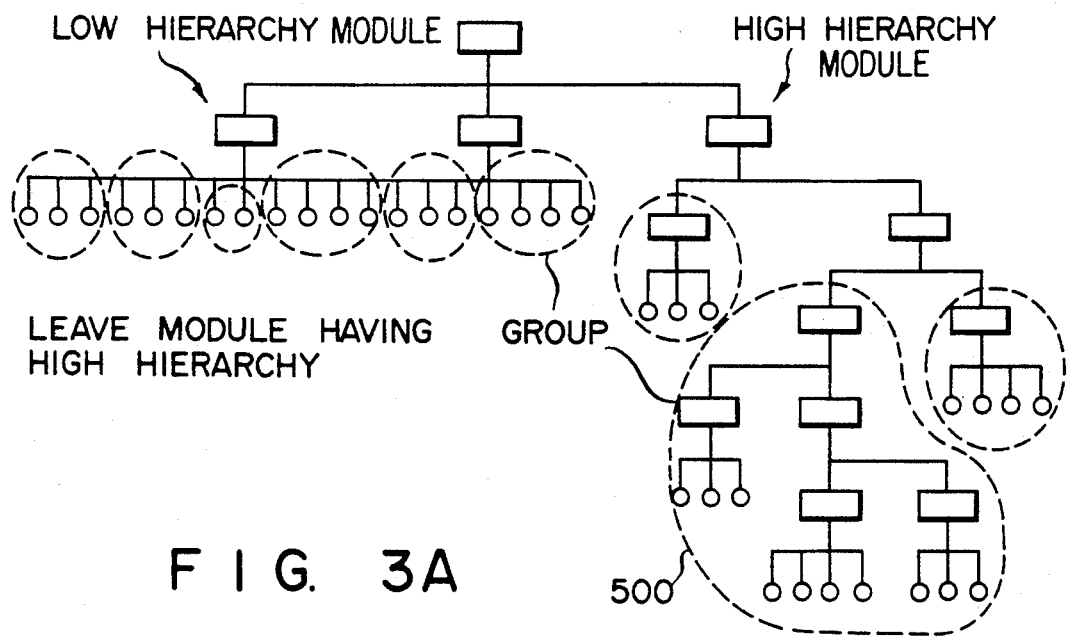
FIGS. 3A and 3B respectively show a method of leaving a module having a high hierarchy, and a method of leaving a module having a low hierarchy.
Figure 3B:
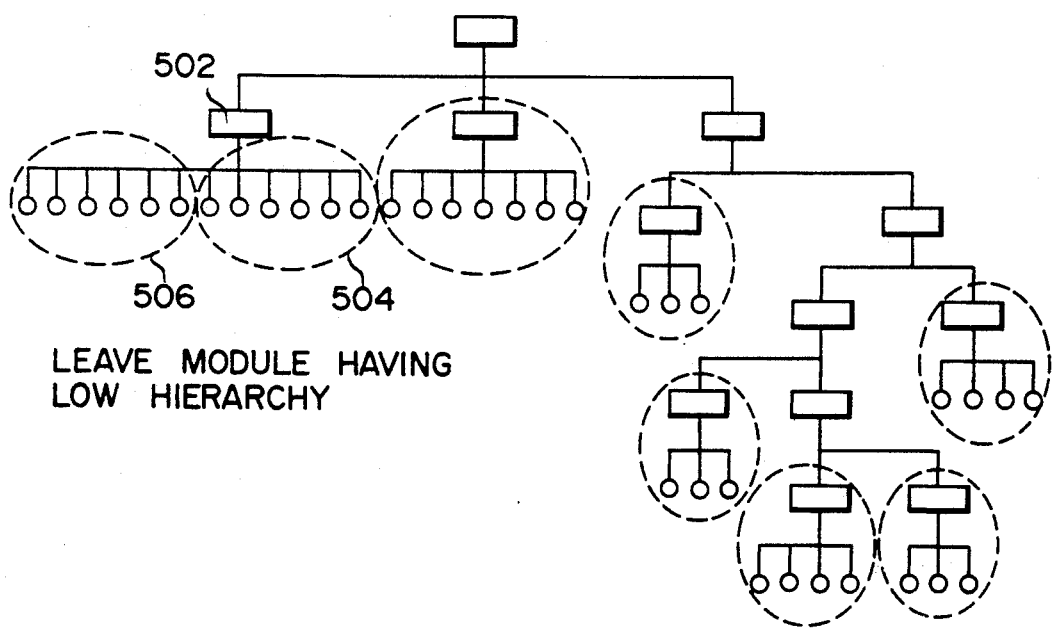

FIG. 2 shows the processing flow of the first embodiment. In step 100, preprocessing is executed. In step 101, a magnitude of division is determined based on an instruction of magnitude of division. In step 102, a module to be preferentially left is selected. If it is selected in step 102 to leave a module of a high hierarchy, the module including another module having a height greater than 1 and a small area thereunder is divided into large parts (step 103). This state is shown in FIG. 3A. In FIG. 3A, a divided module 500 including another module having a height greater than 1 and a small area thereunder is obtained. The flow advances to step 105, and the remaining module is divided. In step 106, layout is executed. If it is selected in step 102 to leave a large module, a module having a height 1 and a large area is divided into great parts (step 104). This state is illustrated in FIG. 3B. In FIG. 3B, a module 502 having a height 1 and a large area is divided into groups 504 and 506. Thereafter, the flow advances to steps 105 and 106. Otherwise, in step 102, the flow advances to step 105, and the remaining module is divided. Layout is executed in step 106.

Figure 4:
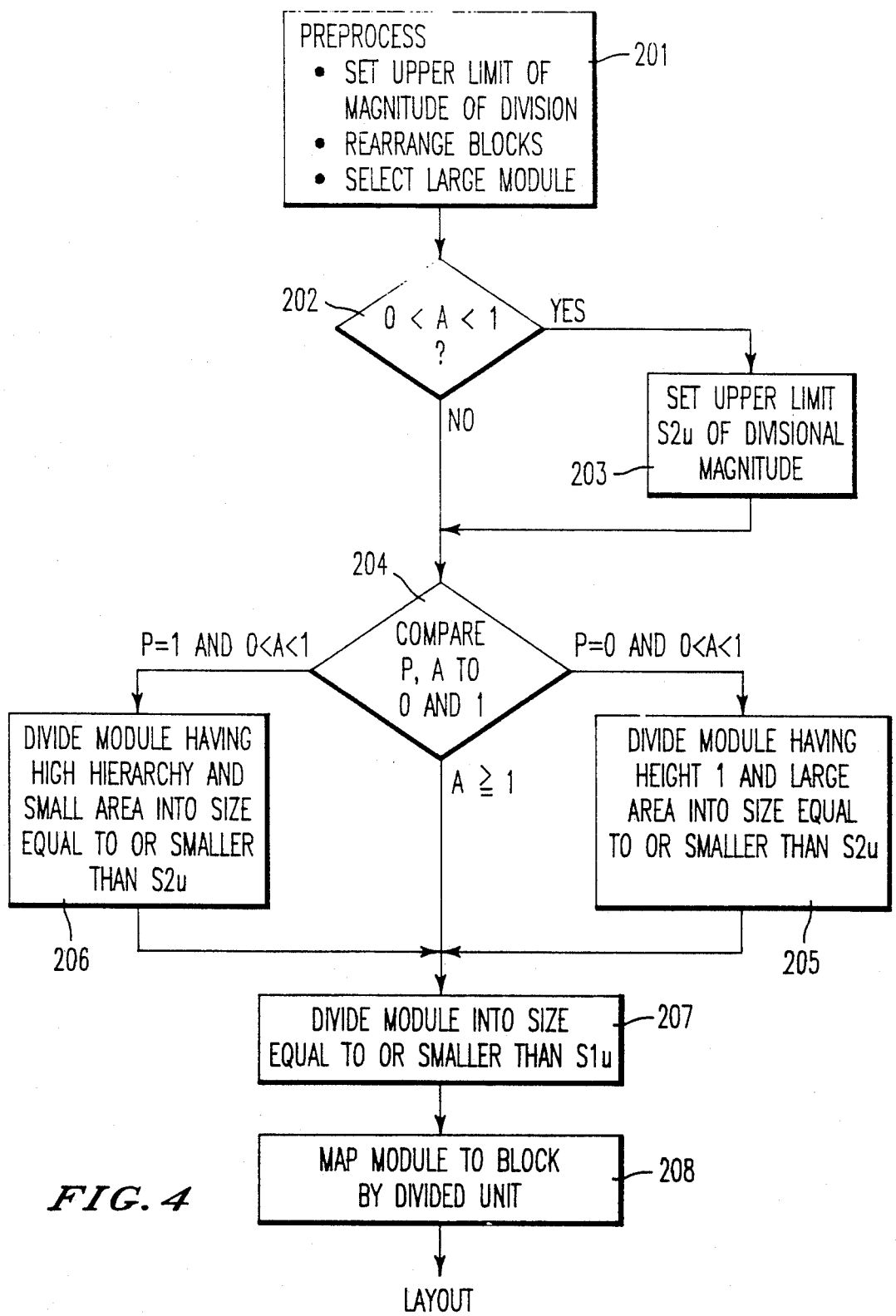
FIG. 4 is a flow chart of processing according to the second embodiment of the present invention.

The further detailed second embodiment will be described below with reference to FIG. 4. In the second embodiment, selection of a divisional unit of layout design between a module having a great height and an occupation area which is not extremely large and a module having a low hierarchy and a relatively small occupation area is realized by using a variable P in the following processing flows 3 to 6. In (3) of a processing flow 1, an upper limit value of an occupation area of a module is obtained based on a condition used for realizing the layout, i.e., the size, number, arrangement of a plurality of blocks predetermined in a chip, and a variable A given from outside for adjusting the magnitude of division.

As shown in FIG. 5A, when a chip is constituted by a plurality of small blocks, the standard value and upper limit of division are set to be small. As shown in FIG. 5B, when a chip is constituted by a plurality of large blocks, the standard value and upper limit of division are set to be large. In this manner, a semiconductor integrated circuit is designed based on the magnitude of blocks to be actually arranged. The design procedures will be explained below.

1. Preprocessing (step 201)

In this preprocessing, the upper limit of the magnitude of division is set, blocks are numbered in the order of larger blocks, and a large module is selected.

(1) An average RM of magnitudes of blocks is calculated.

(2) A standard deviation of the magnitudes of blocks is calculated, and an average magnitude RM' is calculated in consideration of a variation in magnitudes.

(3) A standard value S1u is calculated.

$$S1u = RM'/BPN/A$$

where BPN is a variable for adjusting the magnitude of a group, and A is a variable given from outside for adjusting the magnitude of a group.

(4) An arrangeable area of each block is calculated.

(5) A permutation Rsize {R1, R2, ..., Rn} in which blocks are rearranged in the order of larger blocks is formed.

(6) A permutation Nsize={N1, N2, ..., Nn} in which modules having a height 1 and an area larger than S1u are rearranged in the order of larger modules is formed.

2. When $0 < A < 1$ is satisfied in step 202, the flow advances to step 203.

In step 203, an upper limit S2u satisfying S1u < S2u is set. The upper limit S2u indicates an upper limit of a large divisional magnitude. Thereafter, the flow advances to step 204. When $A \geq 1$ is satisfied in step 202, the flow advances to step 204.

3. If P=O and $0 < A < 1$ in step 204, the control advances to a processing flow 4 (step 205) (to be described later).

When P=0 and $0 < A < 1$, the control advances to a processing flow 5 (step 206) (to be described later). When A > 1, the control advances to processing flow 6 (step 7) (to be described later).

4. (1) For all modules Ni of the permutations Nsize satisfying S2u < Ni, modules Ni are divided into the minimum number of divisions having an area equal to or smaller than S2u.

(2) A processing flow 6 (step 207) (to be described later) is executed for all the modules which satisfy Ni < S2u and are excluded from Nsize.

(3) The control advances to a processing flow 7 (step 208) (to be described later).

5. (1) For all the modules except for those belonging to Nsize, the module is followed downward. When an area HN of a cell included below the module satisfies HN < S2u, division is made at the module to form a group.

When S2u < HN, the above operation is repeated for the lower module.

(2) The following processing flow 6 (step 207) is executed for modules belonging to Nsize.

(3) The control advances to a processing flow 7 (step 208) (to be described later).

6. (1) For modules of Nsize, modules Ni are divided into groups having a minimum number of divisions and size equal to or smaller than S1u.

(2) For all the remaining modules, the module is followed downward, and modules which satisfy Ni≦S1u and have a maximum area are grouped into one group.

7. The groups formed in the processing flows 4 to 7 are mapped to blocks.

Figure 6:
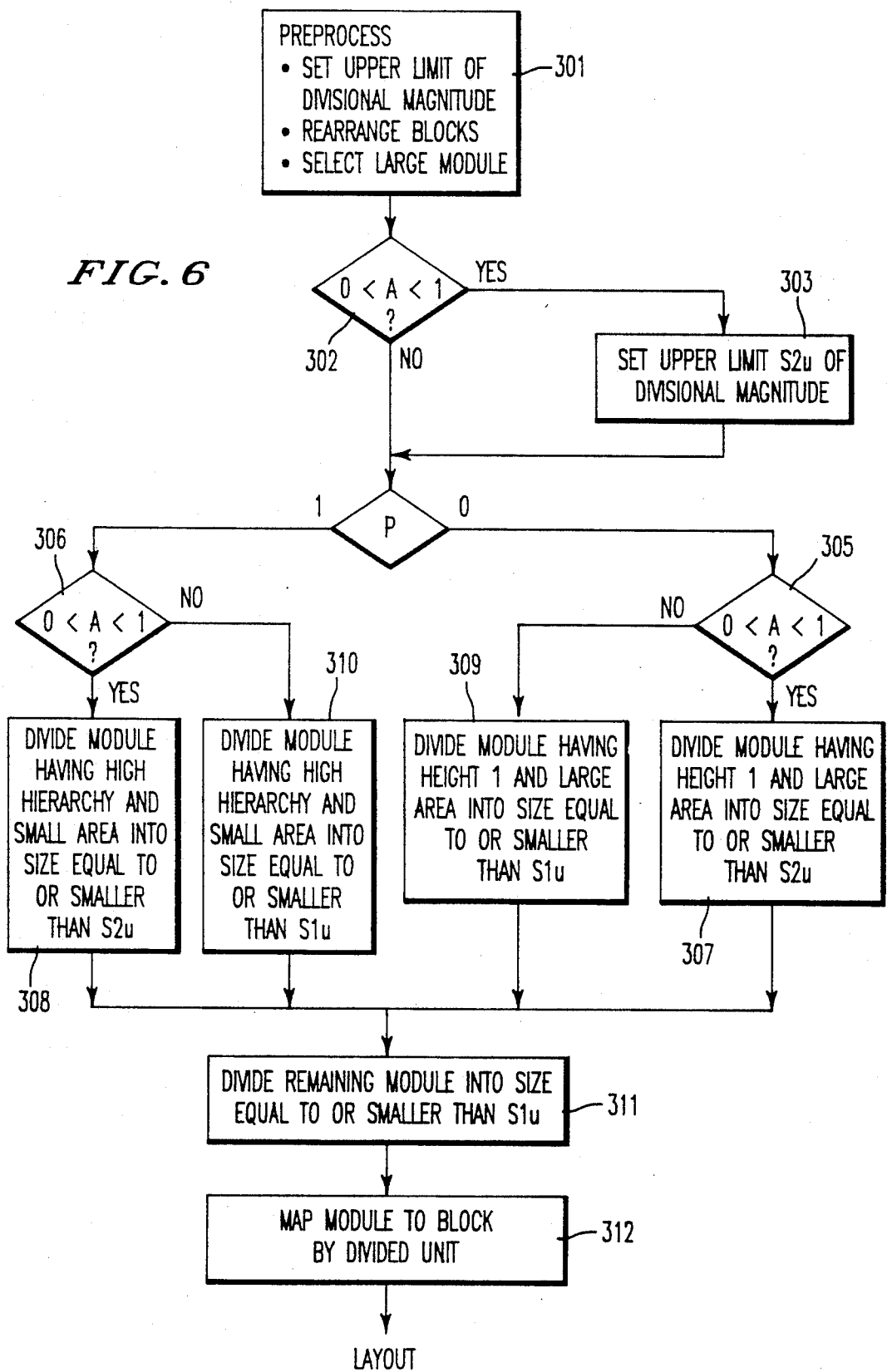
FIG. 6 is a flow chart of processing according to the third embodiment of the present invention.

In addition to the second embodiment, in the third embodiment, the criteria in the processing flow 3 are modified as follows to execute processing (FIG. 6):
when P=0 and 0<A<1,
when P=0 and A≧1,
when P=1 and 0<A<1, and
when P=1 and A≧1

In the second embodiment, when A≧1, both a high module and a large module having a height 1 are divided using the same standard value regardless of the value P. In the third embodiment, a high module and a large module having a height 1 can have different standard values of the magnitude of division depending on the value P. The processing flows of the third embodiment will be described below.

1. Preprocessing (step 301)

In the preprocessing, the upper limit of the magnitude of division is set, blocks are numbered in the order of larger blocks, and a large module is selected.

(1) An average RM of magnitudes of blocks is calculated.

(2) A standard deviation of the magnitudes of blocks is calculated, and an average magnitude RM' is calculated in consideration of a variation in magnitudes.

(3) A standard value S1u is calculated.

$$S1u = RM'/BPN/A$$

where BPN is a variable for adjusting the magnitude of a group, and A is a variable given from outside for adjusting the magnitude of a group.

(4) An arrangeable area of each block is calculated.

(5) A permutation Rsize = {R1, R2, ..., Rn} in which blocks are rearranged in the order of larger blocks is formed.

(6) A permutation Nsize = {N1, N2, ..., Nn} in which modules having a height 1 and an area larger than S1u are rearranged in the order of larger modules is formed.

2. If 0<A<1 is satisfied (step 302), an upper limited S2u satisfying S1u<S2u is set (step 303). The upper limit S2u indicates an upper limit of a large divisional magnitude. Thereafter the flow advances to step 304. If A>1 is satisfied in step 302, the flow advances to step 304.

3. When P=0 and 0<A<1 (steps 302, 303, 304 and 305), the control advances to a processing flow 4.

When P=1 and 0<A<1 (steps 302, 303, 304 and 306), the control advances to a processing flow 5.

When P=0 and A≧1 (steps 302, 304 and 305), the control advances to a processing flow 6.

When P=1 and A≧1 (steps 302, 304 and 306), the control advances to a processing flow 7.

4. (Steps 307 and 311)

(1) For modules Ni of all the permutations Nsize satisfying S2u<Ni, modules Ni are divided into the minimum number of divisions having an area equal to or smaller than S2u.

(2) Modules in Nsize which satisfy Ni≦S2u are grouped to one group.

(3) For modules other than Nsize, groups having a maximum height and an area equal to or smaller than S1u are formed.

5. (Steps 308 and 311)

(1) For all the modules except for those belonging to Nsize, the modules are followed downward. When an area HN of a cell included below the module satisfies HN<S2u, division is made at the module to form a group.

When S2u<HN, the above operation is repeated for the lower module.

(2) Modules belonging to Nsize are divided by the minimum number of divisions to have an area equal to or smaller than S1u.

6. (Steps 309 and 311)

(1) For modules Ni of all the permutations Nsize satisfying S1u<Ni, modules Ni are divided by the minimum number of divisions to have an area equal to or smaller than S1u.

(2) Modules of Nsize which satisfy Ni<S1u are grouped to one group.

(3) Modules other than Nsize are grouped to groups having an area equal to or smaller than S1u.

7. (Steps 310 and 311)

(1) For all the modules except for those belonging to Nsize, the modules are followed downward. When an area HN of a cell included below the module satisfies HN<S2u, division is made at the module to form a group.

When S1u<HN, the above operation is repeated for the lower module.

(2) Modules belonging to Nsize are divided into the minimum number of divisions to have an area equal to or smaller than S1u.

8. The groups formed in the processing flows 4 to 7 are mapped to blocks (step 312).

As the fourth embodiment, when P=0 blocks to be mapped are determined, and a module can be divided depending on the sizes of blocks.

In the second to fourth embodiments, blocks are initially present on a chip. In the fifth embodiment, a module is divided based on P and A, and resultant groups can be laid out as one block. More specifically, the fifth embodiment provides a method of determining blocks on a layout on the basis of optimal division of a logical connection description.

The above embodiments are merely examples. A module of any hierarchy to be divided into small parts and its magnitude can be variably determined using the two variables A and P. When other variables are used, desired classification can be attained. A standard value can be set to match with the following processing. For example, the standard value can be adjusted as follows. When groups are replaced to change a block to be mapped, the standard value is decreased. When groups are not replaced and are left in a block to which they are initially mapped, the standard value is increased to maintain a hierarchical structure.

Figure 7:
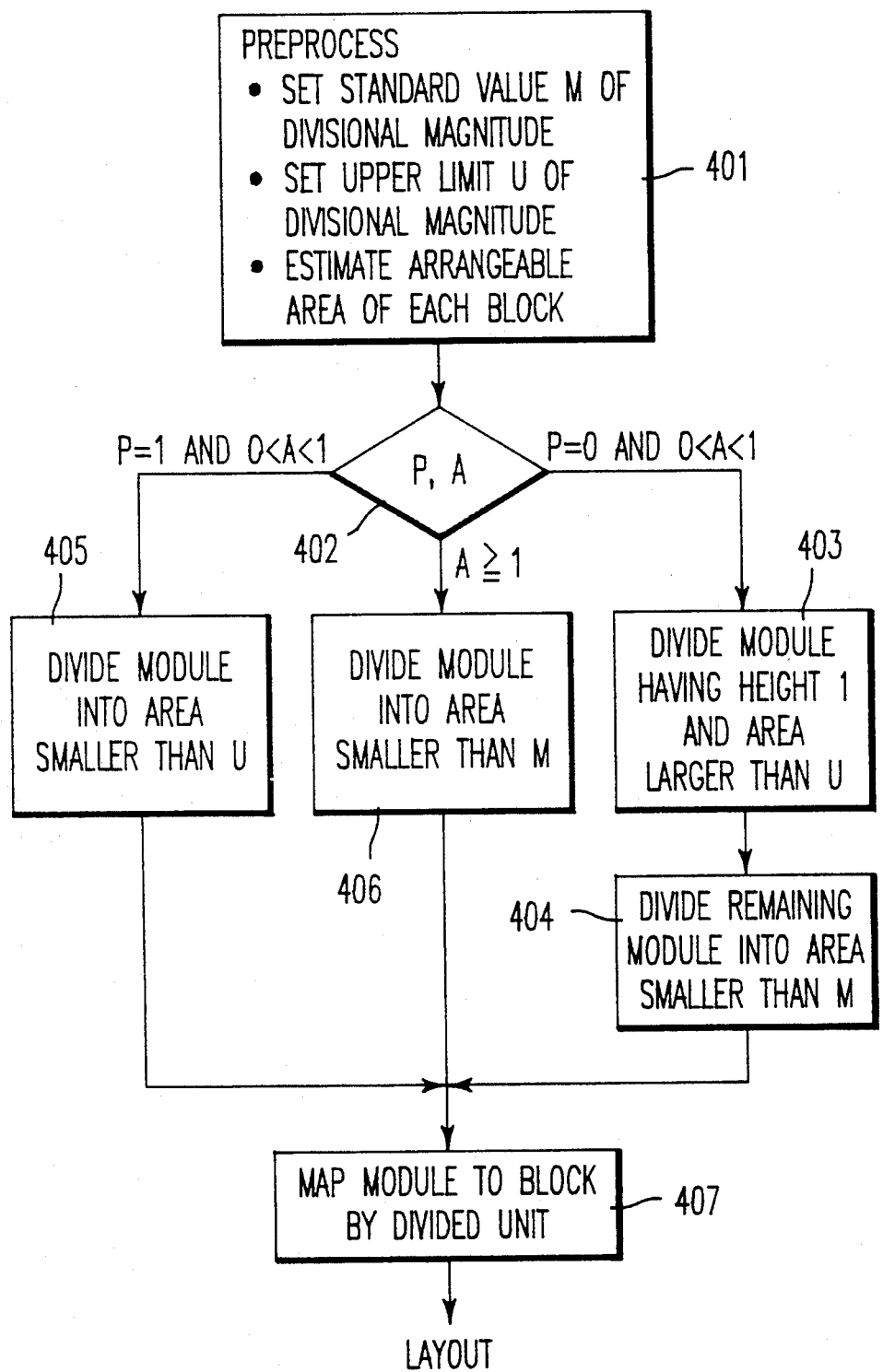
FIG. 7 is a flow chart of processing according to the sixth embodiment of the present invention.

The sixth embodiment will be described below with reference to FIG. 7. In the sixth embodiment, the magnitude of division is determined on the basis of the magnitude of a module having a height 1. In the sixth embodiment, selection of a divisional unit of layout design between module having a high hierarchy and an occupation area which is not extremely large and a module having a low hierarchy and a relatively small occupation area is realized by using a variable P in the following processing flows. In a processing flow 1, the upper limit of an occupation area of a divided module when a layout is realized is obtained based on a condition, i.e., the size and number of a module of height 1 and a variable A for adjusting the magnitude of division.

1. Preprocessing (Step 401)

In this preprocessing, a standard value M and an upper limit U of the magnitude of division are set to calculate an arrangeable area of each block.

(1) An average NM of a magnitude of a module having a height 1 is calculated.

(2) A standard deviation of the magnitude of the module having a height 1 is calculated, and an average magnitude NM' is calculated in consideration of a variation in magnitudes.

(3) The standard value M of the magnitude of division is calculated.

$$M = (NM' \cdot An)/A$$

where An is a variable larger than 1. for adjusting the magnitude of each group.

(4) The upper limit U of the magnitude of division is calculated.

$$U = M \cdot Un$$

where Un is a variable larger than 1, for adjusting the magnitude U of division.

(5) An arrangeable area of each block is estimated.

2. When P=0 and 0<A<1 (steps 402, 403, 404)

(1) A module having a height 1 and an area larger than U is divided into the minimum number of divisions to have an area smaller than U (step 403).

(2) The remaining non-divided modules are followed downward, and the module is divided at a hierarchy where the area of the module becomes smaller than M (step 404).

3. When P=1 and 0<A<1 (steps 402, 405)

(1) Modules are followed downward, and a module is divided at a hierarchy where the area of the module becomes smaller than U. When a module having a height 1 and an area larger than U is found, (2) below is executed.

(2) The module is divided into the minimum number of divisions to have an area smaller than M.

4. When A≧1 (steps 402, 406)

(1) Modules are followed downward, and a module is divided at a hierarchy where the area of the module becomes smaller than M. When a module having a height 1 and an area larger than M is found, (2) below is executed.

(2) The module is divided into the minimum number of divisions to have an area smaller than M.

5. The groups formed in the flows 2 to 4 are mapped to blocks on the layout (step 407).

As the seventh embodiment, the upper limit U of the magnitude of division determined in (4) of the processing flow 1 is corrected according a value B derived from a condition such as the magnitude, number, arrangement, and the like of blocks on the layout. The seventh embodiment takes the hierarchical structure of a logical connection description as the characteristic feature of the present invention, and the feature on the layout into consideration. A detailed method of determining B will be described below.

$$B = RM'/Un$$

where RM' is the same as those in the second embodiment

In this case, a correction value M' of M calculated in (3) of the processing flow 1 of the sixth embodiment is determined as follows using the relationship between magnitudes of M and U:

When M≧B.

$$U = B$$

$$M' = B/Um$$

When M≧B.

$$U = U$$

$$M' = M$$

where, Um is given in program and larger than 1.

The layout design is made using M' as the standard value in the same manner as in the second and fifth embodiment.

Additional advantages and modifications will readily occur to those skilled in the art. Therefore, the invention in its broader aspects is not limited to the specific details, representative methods, and illustrated examples shown and described. Accordingly, various modifications may be made without departing from the spirit or scope of the general inventive concept as defined by the appended claims and their equivalents.

What is claimed is:

1. A method of designing a semiconductor integrated circuit device using a standard cell or gate array method, wherein a chip is divided into a plurality of blocks to realize a hierarchical layout design in units of blocks, the method comprising the steps of:

(a) selecting one of a first scheme of preferentially dividing a first module constituting a logical connection description and having a large height and an occupation area smaller than a standard value, as a unit of layout design, and a second scheme of preferentially dividing a second module having a small height and an occupation area larger than the standard value, as the unit of the layout design, in accordance with hierarchical structure of the modules in the logical connection description; and (b) executing a process for dividing he first or second module in correspondence with areas of the plurality of blocks, using a computer on the basis of the selected on of the first and second schemes.

2. A method according to claim 1, wherein in the step (b), an upper limit of the occupation area of a divided module can be selected in accordance with a condition constituted by the occupation area, number, and arrangement of the plurality of blocks, and the first or second module is divided using the condition as the upper limit.

3. A method of designing a semiconductor integrated circuit device using a standard cell or gate array method, wherein a chip is divided into a plurality of blocks to realize a hierarchical layout design in units of blocks, said method comprising the step of:

(a) selecting one of a first scheme of preferentially dividing, as a unit of the layout design, a first module constituting a logical connection description and having a high hierarchy and a maximum occupation area smaller than an upper limit, the upper limit having a value larger than a specific standard value and determined by the standard value, and a second scheme of preferentially dividing, as the unit of the layout design, a second module to have a size equal to or smaller than the upper limit, the second module having a low hierarchy and nan occupation area larger than the standard value in accordance with hierarchical structure of ht modules int eh logical connection description; and (b) executing a processing for dividing the first or second module using a computer on the basis of the selected one of he first and second schemes.

4. A method according to claim 3, wherein the standard value and the upper limit of the occupation area when a layout is realized by divided modules can be selected in accordance with a condition constituted by the occupation area, number, and arrangement of the plurality of blocks, and the first or second module is divided using the condition as the upper limit.

5. A method according to claim 3, wherein the standard value and he upper limit of the occupation area can be selected in accordance with a condition for a hierarchical structure of a module, which is determined based on the number of the module having a predetermined height and a presumed area, and the first or second module is divided using the condition as the upper limit.

6. A method according to claim 3, wherein the standard value and the upper limit of the occupation area can be selected in accordance with a first condition constituted by the occupation area, number, and arrangement of the plurality of blocks, a second condition for a hierarchical structure of a module, which is determined based on the number of the module having a predetermined height and a presumed area, and a relationship between the first and second conditions, and he first or second module is divided using the upper limit.

7. A computer implemented methodology for designing a semiconductor integrated circuit device using a standard cell or gate array method, wherein a chip is divided into a plurality of blocks to realize a hierarchical layout design in units of blocks, said method comprising the step of:

(a) selecting one of a first scheme of preferentially dividing a first module, as a unit of a layout design, the first module having a high hierarchy and a maximum occupation area smaller than an upper limit, the upper limit having a value larger than a standard value and determined by the standard value, and a second scheme of preferentially dividing a second module to have a size equal to or smaller than the upper limit, as a unit of the layout design, the second module having a low hierarchy and the occupation area larger than the standard value; and (b) realizing the hierarchical layout design in units of blocks on the basis of the selected one of the first and second schemes, the first or second module being divided in correspondence with the plurality of blocks.

* * * * *